US008638968B2

(12) United States Patent
Gladwin

(10) Patent No.: US 8,638,968 B2
(45) Date of Patent: Jan. 28, 2014

(54) LOW-PROFILE LOUDSPEAKER DRIVER AND ENCLOSURE ASSEMBLY

(75) Inventor: Timothy A. Gladwin, Pakenham (CA)

(73) Assignee: DEI Headquarters, Inc., Vista, CA (US)

( * ) Notice: Subject to any disclaimer, the term of this patent is extended or adjusted under 35 U.S.C. 154(b) by 603 days.

(21) Appl. No.: 12/982,584

(22) Filed: Dec. 30, 2010

(65) Prior Publication Data

US 2011/0164774 A1 Jul. 7, 2011

Related U.S. Application Data

(60) Provisional application No. 61/291,855, filed on Jan. 1, 2010.

(51) Int. Cl.
*H04R 1/20* (2006.01)
*H05K 5/00* (2006.01)

(52) U.S. Cl.
USPC .......................................... 381/345; 181/150

(58) Field of Classification Search
USPC .................. 381/345, 380, 431; 181/148, 150
See application file for complete search history.

(56) References Cited

U.S. PATENT DOCUMENTS

| | | | | |
|---|---|---|---|---|
| 6,925,191 | B2 * | 8/2005 | Petroff et al. | 381/386 |
| 7,292,702 | B2 * | 11/2007 | Hagman | 381/345 |
| 2002/0146140 | A1 * | 10/2002 | Chiu | 381/386 |

* cited by examiner

*Primary Examiner* — Brian Ensey

(74) *Attorney, Agent, or Firm* — J.A. McKinney & Assoc., LLC

(57) ABSTRACT

A high fidelity, low-profile loudspeaker assembly includes an enclosure having a rear panel which is highly thermally conductive. At least one speaker driver is mounted in the enclosure, the driver including a forwardly facing diaphragm driven by a voice coil former carrying a voice coil, and a rearwardly extending motor structure. An aperture is provided in the rear panel to receiving the driver's motor structure, and a thermally conductive gasket seals the rear panel aperture around cup to provide a thermal path from the driver motor to the rear panel for cooling the driver. On one driver embodiment, a generally dome-shaped annular spider surrounds and supports the voice coil former, the spider being connected at its inner periphery to the approximate vertical midpoint of the voice coil former.

20 Claims, 6 Drawing Sheets

LOW-PROFILE LOUDSPEAKER DRIVER AND ENCLOSURE ASSEMBLY

This application claims priority to and benefit of Provisional Application No. 61/291,855, filed Jan. 1, 2010, and entitled "Low-Profile Loudspeaker Driver and Enclosure Assembly", the entire disclosure of which is hereby incorporated by reference.

BACKGROUND OF THE INVENTION

1. Field of the Invention

The present invention relates to loudspeaker systems configured for use with wall-mounted flat panel displays such as video screens, and more particularly to wall mountable full range high fidelity loudspeaker enclosures having a low profile.

2. Discussion of the Prior Art

Modern flat-panel televisions and other video displays that are designed to be mounted on walls typically have very low-profile, ultra-thin screens, some of which may project away from the surface of a wall on which it is mounted by less than two inches. Traditional loudspeaker systems that are often used with such display devices to provide enhanced sound quality, are very much like traditional high fidelity loudspeaker systems. A high-fidelity loudspeaker system should be able to reproduce recorded music or soundtrack signals over a usefully broad frequency range at satisfying loudness levels with low distortion.

Typical observations made by a layperson when first encountering high quality audio reproduction are that the sound is "clean" (meaning undistorted and accurately reproduced in rich detail) and "loud" (meaning that the sound pressure level of the playback approaches the sound pressure level ("SPL") of the reproduced performance or event). When used in a home theater setting, High fidelity loudspeaker systems are typically relatively large and bulky, since large cabinet or enclosure volumes provide greater efficiency and bass extension, among other benefits. If a traditional high fidelity loudspeaker system is mounted on a wall, the speaker protrudes or projects away from its wall mount a considerable distance and as a consequence appears aesthetically displeasing and out of place, particularly when attached on the wall near a video display.

Part of the problem with traditional loudspeaker system designs arises from using enclosures having dynamic loudspeaker drivers, where the largest driver's component parts are aligned along a central axis, coaxially with a voice coil in such a way that the driver motor structure projects back from the front of the loudspeaker enclosure by a significant depth. In addition, the interior volume of the enclosure and its wall thicknesses add to its front-to-back thickness, producing a very thick, deep or high profile loudspeaker system. Although such loudspeaker systems perform well acoustically, they do not match the sleek appearance of modern "flat panel" video displays. Accordingly, there is a need for an improved low-profile panel loudspeaker system that combines the aesthetics of a thin flat-panel video display with the loud, clear high fidelity performance of a conventional large, high-profile speaker system.

OBJECTS AND SUMMARY OF THE INVENTION

Accordingly, it is an object of the present invention to overcome the above mentioned difficulties by providing a low-profile loudspeaker system having a driver mounted in an enclosure having a reduced front-to-back dimension while maintaining high performance system audio fidelity.

For the purposes of clarity in the following description the low-profile system of the present invention will be referred to as consisting of an enclosure, or cabinet, in which is mounted one or more loudspeaker drivers, with each driver incorporating a sound radiator, or diaphragm, a diaphragm suspension, and a driver motor which includes a driver magnetic circuit having a permanent magnet and a movable voice coil located in a gap in the magnetic circuit and connected to the diaphragm by a voice coil former. Briefly, the speaker enclosure of the low-profile loudspeaker system of the invention has front and rear panels joined by side walls, and at least one low-profile loudspeaker driver assembly mounted on the front panel. The driver assembly includes a forward-facing sound radiator and a rearward-extending driver motor suspended from the front panel, as by a supporting basket structure, with the rearward portion of the driver motor extending through a corresponding aperture in the rear panel.

More particularly, in accordance with the present invention the acoustic radiator for the low-profile loudspeaker system driver includes a domed diaphragm secured to the forward end of a cylindrical voice coil former which carries a conventional voice coil at proximate its rearward end. The circumferential edge of the diaphragm is suspended in a basket flange mounted in the front panel, which may be referred to as a front baffle, of the speaker enclosure by a conventional diaphragm surround, while the voice coil former is suspended in the basket support structure by a flexible, generally arcuate spider. The spider is attached at its inner circumference at or near the lengthwise, or axial, midpoint of the coil former, and is secured at its outer circumference to the basket. In the preferred form of the invention, the spider is folded and is generally dome-shaped, or convex, when at rest, having an overall curvature which generally parallels the forward slope of the diaphragm. This configuration positions the voice coil former so that it extends forwardly toward and through the front panel, or baffle, to reduce the profile of the speaker.

The loudspeaker system driver motor magnetic circuit incorporates a low-profile cup-shaped pot having an upper rim which surrounds and is spaced from the voice coil carried by the coil former. A permanent magnet is secured to the bottom wall of the pot, with a suitable pole piece being mounted on the magnet and extending into the coil former. The pole piece cooperates with the rim of the pot to form a magnetic gap, with the voice coil being movable within the gap to drive the diaphragm in known manner. The bottom of the pot extends into and through a corresponding aperture in the rear panel of the enclosure to further reduce the depth required for the enclosure, thereby enhancing the low profile of the enclosure.

Since current flow in the voice coil for driving the diaphragm can produce a considerable amount of heat, the location of the pot in the rear panel aperture helps to cool the driver. To improve heat dissipation, the pot is surrounded by a thermally conductive sleeve which is part of the support basket and which centers and secures the driver in the rear panel and provides a thermal path from the pot to the panel by way of a thermally conductive gasket. In the preferred form of the invention, the driver is mounted within a loudspeaker enclosure that is fabricated from a rigid, thermally conductive material such as aluminum, which serves not only as a heat radiator, but which provides a solid, vibration-free environment. The gasket which secures the driver in the rear panel aperture also serves to seal the enclosure for improved sound quality.

The low-profile enclosure of the present invention may incorporate one or more loudspeakers constructed in the manner described above, which may serve as acoustical woofers having a wide frequency response. In one embodiment, the enclosure may be elongated in shape, carrying, for example, two woofer loudspeakers and two mid-range speakers mounted in a row with one or more conventional tweeters, and with the face of the enclosure covered by a suitable screen, or grille. Using the above-described driver construction for the woofers, and for the mid-range speakers if desired, the resulting enclosure will have thickness of 1.5 inches. When the speaker system of the present invention is mounted on a user's wall, the total installed on-wall depth of the speaker system is not more than 1.6 inches or forty millimeters (40 mm). Other speaker configurations within enclosures of various shapes may be used, while retaining the low profile thickness, to provide an aesthetic match for a thin-screen television or other display unit, while providing high quality sound reproduction.

BRIEF DESCRIPTION OF THE DRAWINGS

The foregoing, and still further objects, features and advantages of the present invention will become apparent upon consideration of the following detailed description of a specific embodiment thereof, particularly when taken in conjunction with the accompanying drawings, wherein like reference numerals in the various figures are utilized to designate like components, and wherein.

DETAILED DESCRIPTION OF PREFERRED EMBODIMENTS

Turning now to a more detailed description of the present invention, the Figures illustrate specific preferred loudspeaker structural embodiments and mounting methods for the low-profile loudspeaker driver and enclosure assembly of the present invention. As described above, and as illustrated in the embodiment of FIGS. 1-5, a low-profile loudspeaker driver and enclosure assembly, or loudspeaker system 10, constructed in accordance with the present invention may include an elongated, rectangular cabinet, or enclosure, 12 having a front panel, face plate or baffle 14 upon which are mounted a plurality of loudspeaker transducers. In this illustration, seven loudspeaker transducers or drivers 16, 18, 20, 22, 24, 26, and 28 are aligned along the length of the enclosure, with transducer 22 being illustrated as a tweeter and the remaining transducers being midrange or woofer transducers, it being understood that a different number or mix of transducers may be used and that they may be arranged in the enclosure as desired to provide optimum sound quality and aesthetics for the desired application.

Figure 1:
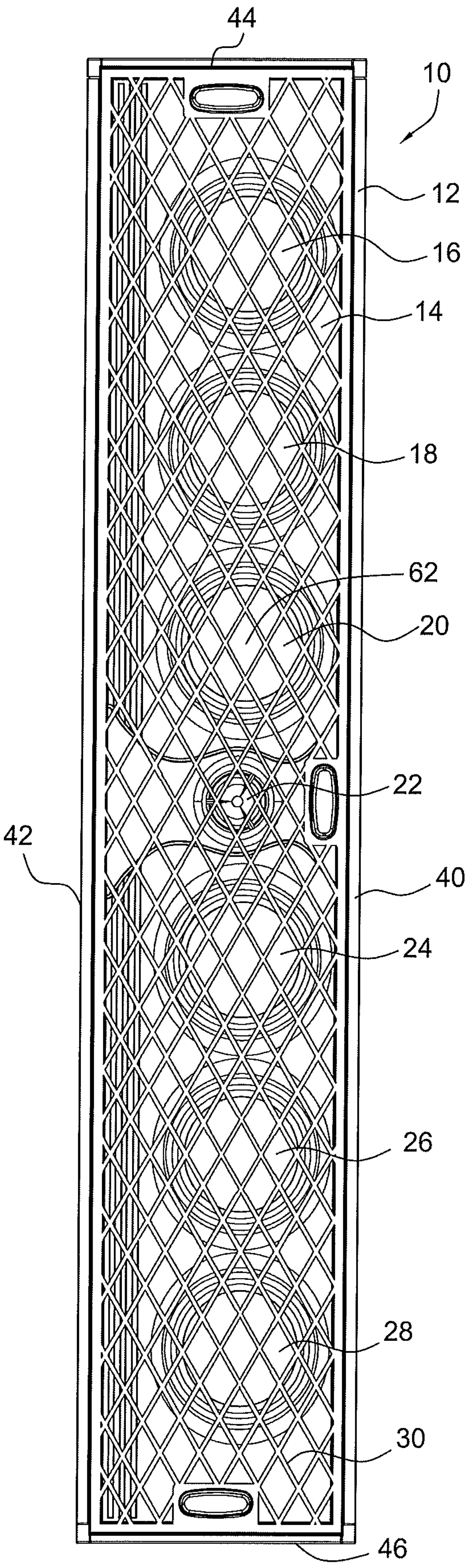
FIG. 1 is a front elevation view of a low-profile loudspeaker system in accordance with the present invention, illustrating an embodiment utilizing an elongated enclosure structure with a front panel incorporating seven loudspeakers, or loudspeaker drivers.
Figure 2:
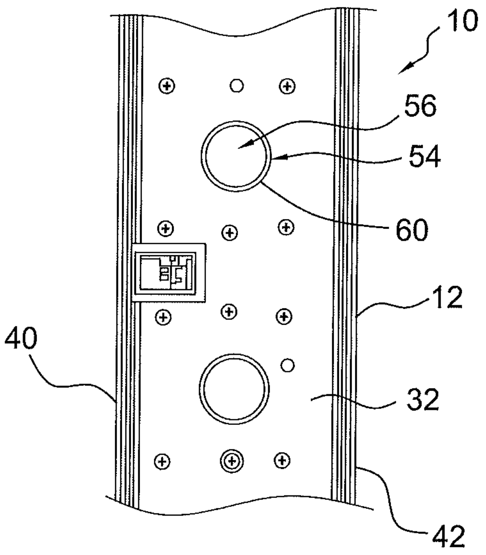
FIG. 2 is a partial rear elevation view of the enclosure of FIG. 1, illustrating speaker driver motor components extending through corresponding apertures in a rear panel of the enclosure of FIG. 1.

The enclosure 12 may have any suitable planar dimensions or shape, with the illustrated elongated configuration being approximately 27 inches in height and 6 inches in width, for example, with the selected configuration advantageously having a front to back thickness or depth of no more than about 1.5 inches. As illustrated in FIG. 1, the front face of the enclosure preferably is covered by a suitable protective, but acoustically transparent, grille or screen 30, while the back of the enclosure includes a rear panel 32, as illustrated in FIG. 2. In the preferred form of the present invention, the enclosure panels are fabricated from a tough, rigid, thermally conductive and attractive material, with the front panel being molded from high temperature ABS filled with glass fiber and incorporating suitable reinforcing ribs or ridges (such as those illustrated at 50 and 52 in FIG. 3) with channels defined therebetween, to maintain the desired non-resonance and rigidity within the structure.

Figure 3:
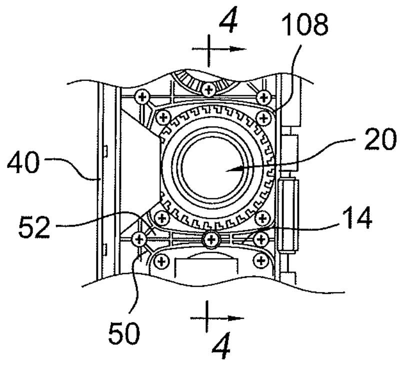
FIG. 3 is a partial interior view showing the rear side of the front panel of the system of FIG. 1.

In FIGS. 1, 2 and 3, loudspeaker transducer 20 is shown from the front and from the interior or the rear, as when rear panel 32 removed. Enclosure 12 incorporates aesthetically contoured extruded aluminum side walls 40 and 42 (see FIG. 2) and end walls 44 and 46 which are affixed with and cooperate with the front panel or baffle 14 and the rear panel 32 to provide an enclosed air chamber in accordance with known speaker design parameters. In the illustrated embodiment, rear panel 32 is fabricated from substantially contiguous, highly thermally conductive, planar metal (e.g., aluminum) extrusion, plate or sheet having a thickness of 2 mm or more (and preferably 2.5 mm.) Because the front baffle 14 and rear panel 32 are rigid or stiff low-profile or thin panels, they have a thinner front-to-back profile than would be required if the baffles or panels were made from a more conventional loudspeaker enclosure material such as Medium Density Fiberboard (MDF). Thinner panels, baffles or enclosure walls maximize interior volume of the enclosure for a given enclosure of fixed exterior dimensions.

As best seen in FIG. 2, the rear panel 32 includes at least one aperture 54 positioned to receive the rearwardly projecting motor structure 56 of a corresponding reduced height, low profile transducer or driver such as the woofer 20, thereby allowing the overall depth of the enclosure or speaker cabinet 10 to be considerably less than that of conventional loudspeaker enclosures. The motor-receiving aperture 54 is sealed around the transducer motor 56 by a thermally conductive gasket 60 which is in intimate thermal contact with the rear wall, or panel, 32 and with the motor structure 56.

The thermally conductive gasket 60 is preferably shaped as an annular ring and is made from Sil-Pad® brand gasket material or the like. Sil-Pad® is a thermally conductive, flexible substrate which provides electrical insulation using a tough carrier material such as fiberglass and silicone rubber. The gasket is conformable and provides a flexible seal that minimizes the thermal resistance to heat from the loudspeaker's motor structure, so that it passes into, and is dissipated by, the thermally conductive rear panel 32 of enclosure 10, which functions as a very large surface area heat sink.

In order to enhance the desired low profile for the speaker enclosure of the present invention, the loudspeaker transducers or drivers 16-20 and 24-28 utilize a dome design, as will be described in greater detail below, to reduce the overall speaker height and thus to allow a low profile enclosure. Since a dome-shaped speaker diaphragm typically has a single point at its center which is higher than every other point on the speaker structure, and since speaker screens, or grilles, are most often curved out, in the illustrated embodiment of the invention the highest point of each speaker diaphragm is located to coincide with the highest part of the screen 30, which in this case is along the longitudinal center line of the enclosure. Because the highest part of the diaphragm is a small area, the illustrated screen is designed to provide an opening, such as that illustrated at 62 for speaker 20 in FIG. 1, at the center of each speaker to accommodate the diaphragm, allowing the overall thickness of the enclosure to be further reduced. Thus, in the illustrated embodiment, the screen has a diamond-shaped pattern, arranged so that there are no ribs in front of the dome peaks of the arrayed speaker diaphragms, thus saving a couple of millimeters of clearance for the excursions of each diaphragm during operation of the speaker system.

Figure 4:
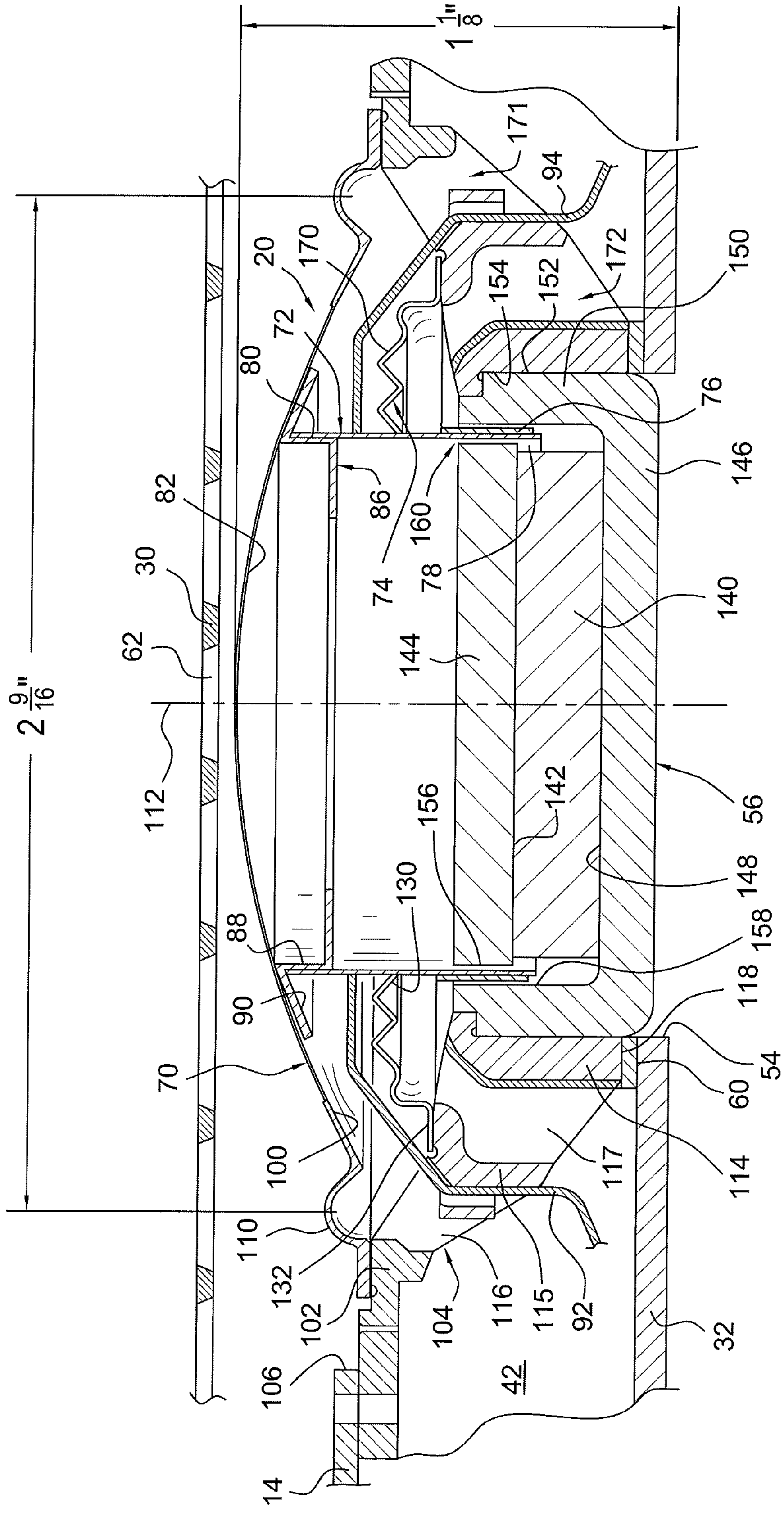
FIG. 4 is a simplified cross-sectional view taken at line 4-4 of FIG. 3, illustrating a low-profile loudspeaker assembly in accordance with the present invention, shown at rest and mounted in the enclosure of FIG. 1.
Figure 5:
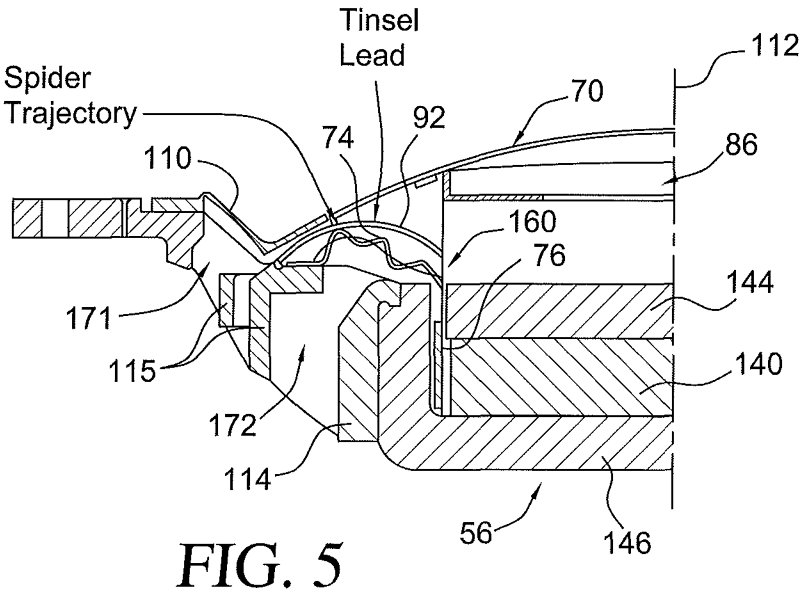
FIG. 5 is a partial view of the loudspeaker of FIG. 4, illustrating the voice coil and diaphragm of the loudspeaker assembly at its maximum inward excursion.

In a preferred embodiment, a loudspeaker driver such as the transducer 20 of system 10 may configured as illustrated in FIGS. 4 and 5, to which reference is now made. The loudspeaker driver 20 is, in this embodiment, a 3.5 inch diameter woofer which includes a dome-shaped diaphragm 70 driven by a driver motor 56 having a substantially cylindrical voice coil former 72. The former 72 is suspended, in part, by a novel and non-traditional annular, resilient, flexible, generally arched, or dome-shaped, spider 74. The voice coil former 72 carries a conventional voice coil 76 proximate its rearward or lower end 78 and is further suspended by being secured at its forward or upper end 80 to the under surface 82 of the diaphragm 70, typically by a light, strong (e.g., treated paper) glue ring 86. In the illustrated embodiment, the glue ring has a vertical cylindrical portion 88 glued to the inner circumference of the coil former and a radially outwardly extending flange portion 90 glued to the under surface of the diaphragm. The voice coil preferably is connected to an external drive audio signal current source (not shown) by one or more conventional tinsel leads such as those illustrated at 92 and 94. The audio signal for each driver is preferably provided via a filter or crossover network (not shown).

The domed diaphragm 70 preferably is fabricated of a light, stiff and gas impermeable material such as aluminum and is suspended at its outer circumference 100 from the top surface of upper annular rim portion or flange 102 of a ventilated driver support basket 104 by way of an annular, flexible surround 110. The surround 110 may be fabricated of thin flexible membrane (e.g., made from rubber) that is shaped to allow inward and outward excursions of the diaphragm along the central axis 112 of the transducer 20, while keeping the diaphragm co-axially centered in the support basket 104, in well known fashion. The basket 104 is co-axially secured in a corresponding aperture 106 in the front baffle 14 of the enclosure, as by suitable fasteners 108 illustrated in FIG. 3.

The driver support basket 104 preferably is fabricated from high-temperature glass-filled polymer (e.g., ABS +GF plastic) or a similar rigid, strong, temperature-resistant, thermally conductive material, is generally bowl or cone shaped, and serves to suspend and to support the loudspeaker driver assembly securely in the enclosure 12. Although it may take many forms, for purposes of illustration the basket 104 is shown as including the upper annular rim or flange 102, a lowermost co-axial annular base sleeve, or ring 114 and an intermediate co-axial support ring 115, all interconnected by multiple radial web portions 116 and 117 spaced apart around the circumference of drive motor 56, with webs 116 extending between the co-axial annular rings 102 and 115, and with webs 117 extending between the rings 114 and 115. The basket is secured to and is suspended from the front panel, or baffle 14 so that the lower base ring 114 is co-axially centered over the corresponding speaker aperture 54. A lower edge 118 of the base ring is sealed to the inner circumference of the co-axial aperture 54 in the rear plate 32 by the flexible gasket 60, as described above with respect to FIG. 2.

As best seen in FIG. 4, the arched, or dome-shaped spider 74 is annular, having an inner periphery 130 secured to the approximate midpoint of voice coil former 72, and having an outer periphery 132 secured to the basket 104, as at the top of intermediate ring 115. The spider guides the voice coil former in its axial motion in response to electrical signals applied to the voice coil, allowing a linear, substantially pistonic reciprocating excursion motion along the central axis 112. And spider 74 is pleated or folded to provide axial flexibility with a constant centering force to keep the voice coil axially centered in the magnetic gap during forward and rearward excursions. Spider 74 is preferably fabricated from a tough, durable and flexible substrate woven from meta-aramid fibers such as Nomex™, or the equivalent Conex™, which are typically offered in several grades of stiffness or compliance. In one illustrative embodiment, the spider material has a compliance specification of 0.6 mm/50 g over the linear peak-to peak excursion range of approximately 1.25 mm, but the final selection is based on desired driver performance.

Arched spider 74 is unusual, and provides a unique configuration for the components of the low profile driver 20. Applicant was aware that push-force to pull force asymmetry was inherent in a domed or arched spider design. However, designing around that force asymmetry was a necessary compromise to make a very low profile driver function satisfactorily. A more typical flat or planar, pleated spider would not fit and provide the peak-to peak push-pull excursion needed. Another option that was considered (and that may be more linear) would be a central spider suspension member in the inside of the voice coil former 72 in front of the motor (not shown), but applicant was not convinced that such a spider would provide the necessary radial stiffness to prevent voice coil rubs. Radial motion of the voice coil (or rocking) is potentially a fatal problem in such a shallow driver because there is very little axial separation of the support points.

The drive motor 56 for the loudspeaker 20 incorporates a permanent magnet 140, carrying on its forward, or top, surface 142 as viewed in FIG. 4, a cylindrical frontplate 144 which is centered on the magnet. The permanent magnet is secured in a cup-shaped pot 146, resting on the bottom wall 148 of the pot and centered within a surrounding annular upstanding pot wall 150. The outer surface 152 of pot 146 is secured to the inner peripheral wall 154 of the bottom ring 115 of the basket 104 so that the ring forms a sleeve in intimate thermal contact with the pot and so the basket supports the pot in the aperture 54 of the back panel 32. The upper end of the pot wall 150 is positioned by the basket to surround at least a portion of the voice coil 76, while the frontplate is positioned within the lower end 78 of the voice coil former 72 opposite the upper end of the pot wall. The outer peripheral surface 156 of the frontplate is spaced from the inner peripheral surface 158 of the pot to form a magnetic circuit having a flux gap 160 in which the voice coil can move when excited by a driver current. The frontplate 144 and pot 146 may be formed of iron or a ferrous metal alloy with high permeability.

In the preferred form of the present invention, the permanent magnet 140 is formed of a rare earth metal neodymium (or Nd), since drivers having Nd motors can be smaller than those which utilize ceramic ferrite motors. More specifically, the neodymium magnet (also known as NdFeB, NIB, Nd or Neo magnet), is a type of rare-earth permanent magnet made from an alloy of neodymium, iron and boron to form the Nd2Fe14B tetragonal crystalline structure. However, the Nd material is much more temperature sensitive than the bulkier and lower cost ceramic ferrite, and because of its relatively small size and low mass, Nd magnet 140 has little heat capacity so it heats up quickly and runs much hotter than ceramic ferrite. At even moderate temperatures of about 80° C., Nd begins to permanently lose its magnetic strength, although below 80° C. the reduction in magnetic strength is reversible, Keeping an Nd motor cool is a serious problem that is solved in accordance with the present invention by exposing the back of the pot 146 of the motor 56 to the outside of the enclosure, through the aperture 54, and by thermally coupling the motor 56 and the sleeve 114 of the basket 104 to the aluminum back panel 32 via the thermally conductive gasket 60.

Figure 6:
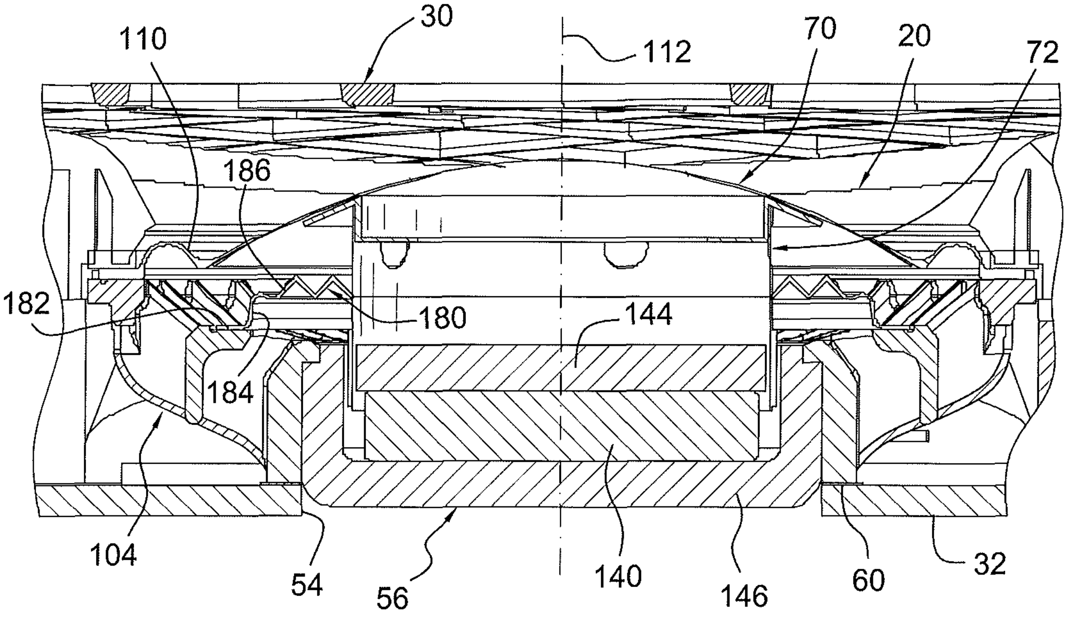
FIG. 6 is a cross-sectional view of another embodiment of a low-profile loudspeaker driver assembly mounted in the enclosure of FIG. 1, in accordance with the present invention.

As shown in FIGS. 2, 5 and 6, driver motor 56 projects rearwardly into and through the open back panel 32, thus allowing heat generated in motor 56 to radiate into the space behind the enclosure. Since driver motor 56 projects rearwardly through the open back panel 32, the heat generated in motor 56 can also cause convection with ambient air behind and around the enclosure. Thus, the driver motor 56 conducts heat into back panel 32, radiates heat rearwardly through the open back panel 32, and by convection transmits heat into the ambient air around driver motor 56 and back panel 32. The advantageous structure and cooling method of the present invention allows the Nd motor to run cool, even in the tight confines of the present speaker. As described above, this placement of the motor in aperture 54 not only cools the motor, but has the further advantage of reducing the overall depth of the loudspeaker and enclosure so that it has, in its preferred embodiment, an overall depth, or height as viewed in FIG. 4, of 1.125 inches as measured from the peak of the diaphragm 70 at the center line 112 to the back of the motor 56.

As noted above, the low profile or reduced depth of the speaker 20 is facilitated by the arched spider 74 described above, which replaces the substantially planar or flat spider typically used in loudspeakers. As illustrated in FIGS. 4 and 5, the radial outer edge of the spider is fastened to the top surface of the intermediate basket ring 115, and curves generally upwardly and radially inwardly in a convex, dome shape to its connection to the voice coil former. Preferably, the curvature of the spider generally follows or parallels and nests within the upward and radially inward convex shape of the diaphragm 70. As a result of this configuration, (as best seen in FIG. 4) the vertical midpoint of the voice coil former 72, where the inner edge 130 of the spider is connected, is above (or forward of) the level of the connection of the outer edge 132 of the spider to the support basket. This allows use of a shorter voice coil former for the loudspeaker, shortens the front-to-back distance between the diaphragm's center and the back surface of the drive motor 56, and provides sufficient clearance between the bottom or rear edge of the voice coil former and the inner surface of the pot 146 to allow the desired excursion of the voice coil, and thus of the diaphragm, in accordance with the invention.

In order to permit the required axial excursions of the voice coil along axis 112 during operation of the speaker driver, the spider 74 incorporates, in known manner, a series of circumferential pleats or folds 170 to provide axial flexibility, while the stiffness of the spider material keeps the voice coil centered on axis 112. Radial motion (or rocking) of the voice coil can be a fatal problem in a shallow driver such as that illustrated herein, because there is very little axial separation of the support points, but it has been found that the arched spider of the invention controls rocking successfully. Applicant has observed that a negligible but non-symmetrical amount of force is required to drive the voice coil and the diaphragm, because an inward (downward as viewed in FIG. 4) axial excursion will compress the spider's pleats or folds 170 onto one another while an outward axial excursion will stretch the folds into an extended frustoconical shape. While any inward (pull-force) to outward (push-force) asymmetry is a potential source of distortion, listening tests and measurements have confirmed that the asymmetry had a minor effect on sound quality (e.g., for driver 20). The driver's response to test signals was measured and demonstrates that most of the push-pull asymmetry is due to the arched spider 74. More significantly however, arched spider 74 controls rocking successfully and provides an large enough acceptably linear range of compliance over the driver's peak-to-peak excursion. Testing has revealed that the asymmetry leads to even-order harmonics during large excursions. Even-order harmonics are generally considered to be benign, or at least much less annoying than odd-order harmonics, and listening tests confirm this.

Although the spider design of the invention does not impair the quality of sound produced by the present loudspeaker, motor linearity can be limiting, since to obtain the reduced depth of this low-profile loudspeaker the voice coil is overhung; that is, the axial length of coil 76 is longer than the axial (front-to-back) length of the gap 160. In an illustrative embodiment of the invention, the coil 76 was 6.5 mm long, but was located, and centered, in a gap 160 that was 4 mm long. In such a configuration, the linear motion of the coil when it begins to leave the gap would be about 1.25 mm in either the upward (push) or downward (pull) direction, and it would be completely out of the gap at about 5.25 mm; however, in accordance with the invention, the driver is designed so that this cannot happen. Thus, the rubber surround 110 is configured and selected to become tight before the coil 76 can completely leave the gap on an upward excursion; for example, at an excursion of 4.07 mm. This is a soft limit, since when the voice coil is almost out of the gap, there is little force left in the voice coil except for inertia. Furthermore, as illustrated in FIG. 5, the distance between the bottom edge of the voice coil and the inner bottom surface of pot 146 is selected so that on its downward excursion the voice coil 76 would bottom on the interior surface of the motor cup 146 at 4.22 mm, if the surround 110 did not stop it. The tinsel leads 92 and 94 are also arched and configured to extend above the spider, as illustrated, to avoid contact with the spider. However, in the illustrated embodiment, the diaphragm would hit the tinsel lead at 4.43 mm if the surround did not stop it and the voice coil failed to bottom. This is not destructive however, and can be avoided by not overdriving the speaker. Also, in the disclosed configuration illustrated in FIG. 5, the spider would bottom on the motor at an excursion of 4.62 mm, which could shear the spider from the voice coil if the connection between the spider and the voice coil former 72 is not given the extra clearance illustrated herein.

It will be noted that accurate motion of the diaphragm in response to drive signals applied to the voice coil is facilitated by the provision of vent holes 171 and 172 in the ventilated basket 104 between the annular rings 102, 114 and 115, and the radial webs 171 and 172 that are spaced around the basket. Vent holes 171 are in communication with the space under the diaphragm, while vent holes 172 are in communication with the space under the spider.

A second embodiment of the present invention is illustrated in FIG. 6, which is similar to the embodiment of FIGS. 4 and 5, and wherein similar elements are similarly numbered. In this embodiment, the low profile of the loudspeaker 20 is maintained by positioning the speaker motor 56 in an aperture 54 of the rear panel 32, as described above. In this case, however, the voice coil former 72 is supported at its approximate midpoint by a generally arcuate, flexible spider 180, which is of similar material and is folded as discussed above for the spider 74, but instead of being dome-shaped it forms a generally "L"-shaped series of pleats or folds in cross section. The outer peripheral edge 182 is secured to the support basket 104, as previously described, and from this connection extends upwardly at shoulder 184 and then inwardly at folded portion 186 along a plane generally perpendicular to the axis 112, with the shoulder 184 forming the short leg of the "L", and the portion 186 forming the long leg of the "L". The upwardly and radially inwardly extending, generally arcuate shape of the spider enables it to be connected to the midpoint of the voice coil former while allowing the former 72 to be shortened to facilitate the desired low profile for the speaker without limiting the excursions of the voice coil when driving the diaphragm 70.

It will be appreciated by persons having skill in the art that the present invention makes a low-profile loudspeaker available in a configuration that is well suited for placement on a user's wall for high fidelity sound reproduction. While low-profile transducer 20 is illustrated with diaphragm 70 configured as a part-spherical dome, other diaphragm shapes are suitable, and the arched or dome-shaped spider 74 can be contoured or configured to nest within those diaphragm shapes and achieve the low profile advantages of the present invention. Similarly, while voice coil former 72 is illustrated and described as cylindrical, other voice coil support structures can be readily adapted for use in the low profile driver of the present invention.

Figure 7:
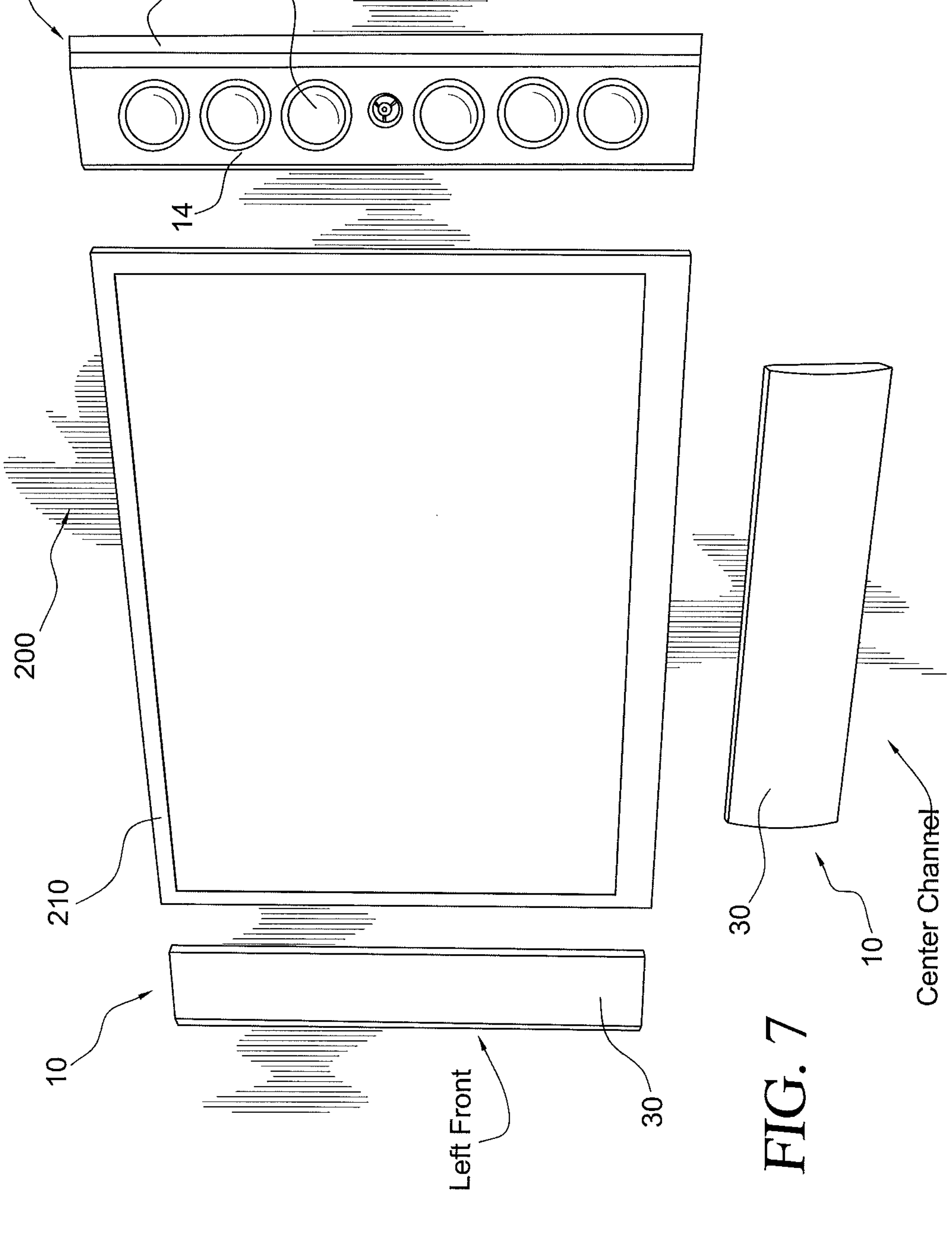
FIG. 7 is a perspective view of an array of low profile on-wall loudspeakers arrayed around a wall-mounted flat panel television or video display, in accordance with the present invention.
Figure 8:
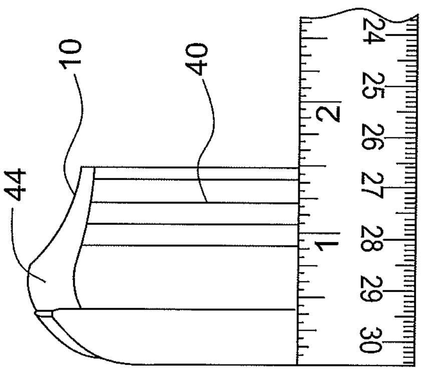
FIG. 8 is a side view of a low profile, on wall loudspeaker system's enclosure, in accordance with the present invention

Loudspeaker system 10 thus provides a multi-driver loudspeaker assembly with an enclosure 12 which can be affixed to a user's wall 200 for use in a home theater system or entertainment system with a flat-panel television or video monitor 210. In a typical home theater system, video monitor 210 is surrounded by a left-front speaker, a right front speaker and a center channel speaker, and, as illustrated in FIG. 7, the speaker system and method of the present invention permit a user to mount low profile loudspeakers on a wall proximate the video monitor in a configuration which allows the speakers to project outwardly from the wall by 1.6 inches or less, because, as shown in FIG. 8, the front to back thickness or depth of speaker 10 is no more than 1.5 inches (as illustrated by ruler 300).

The loudspeaker system 10 is therefore very shallow or thin, but still is fairly characterized as a "full range" high fidelity loudspeaker system, meaning that it will reproduce almost all of audible spectrum. A principal objective for the loudspeaker system of the present invention was to cover the vocal range and up (e.g., 180 Hz-20 kHz) solidly, and to allow home theater system's powered subwoofer (not shown) to cover the frequencies below 180 Hz. Loudspeaker system 10 is readily adapted for a range of models, and an exemplary embodiment meets the following specifications, when mounted on wall 200:

Dimensions (mounted on wall without bracket): 27" H×6" W×1-112" D (68.6 cm×15.2 cm×38 mm);

Dimensions (mounted on wall with bracket): 27" H×6" W×1-9/16" D (68.6 cm×15.2 cm×40 mm);

Driver complement: 2 each 3½" (90 mm) XTDD anodized Aluminum dome mid/bass drivers pressure-coupled to 4 each 3½" (90 mm) dome low-bass radiators, 1 each 1" (25 mm) Pure Aluminum Dome Tweeter;

Frequency response (overall on wall): 117 Hz-20 kHz (plus or minus 5 dB); Sensitivity: 92 dB nominal;

Impedance: 8 Ohms nominal;

Recommended amplifier power: 20-100 Watts per channel;

Enclosure: Extruded Aluminum; and

Product weight: 5.1 lbs. (2.3 kg).

As noted above, a high-fidelity loudspeaker system should be able to reproduce recorded music or soundtrack signals over a usefully broad frequency range at satisfying loudness levels with low distortion. The easily recognized characteristics for high quality audio reproduction are (as noted above) that the sound is "clean" (meaning undistorted and accurately reproduced in rich detail) and "loud" (meaning that the sound pressure level of the playback approaches the sound pressure level ("SPL") of the reproduced performance or event).

Many learned treatises have been authored on the subject of measuring and characterizing loudspeaker performance, so the instant description cannot provide a completely rigorous treatment defining the specifics of measuring acoustic performance or subjective evaluation of loudspeaker systems, but, for purposes of this description, the applicant has developed a working definition for performance which meets the expectations of listeners seeking recognizable "high fidelity" performance. For purposes of nomenclature in this description and the appended claims, a "high fidelity loudspeaker system" is defined as a loudspeaker system which will play cleanly (i.e., with a measured distortion THD <1%) and loudly (i.e., the speaker achieves at least 100 dB SPL at or below the distortion limit) over a broad frequency range (e.g., from 150 Hz-20 kHz).

A principal objective for the loudspeaker system of the present invention was to cover the vocal range and up (180 Hz-20 kHz) solidly, and to allow home theater system's powered subwoofer to cover the frequencies below 180 Hz. Applicant has measured the performance of loudspeaker system 10 and those measurements generated SPL curves (smoothed only to remove the measurement noise) taken in both 2 pi (on-wall) and 4 pi (free field-anechoic) conditions. A planar wall (e.g., 200) is known to boost low frequencies, but increase interference effects. The applicant's measurements included an average of the on-wall and free space curves (sometimes referred to as "sound power" curves), which may be more indicative of the in-room experience.

Figure 9:
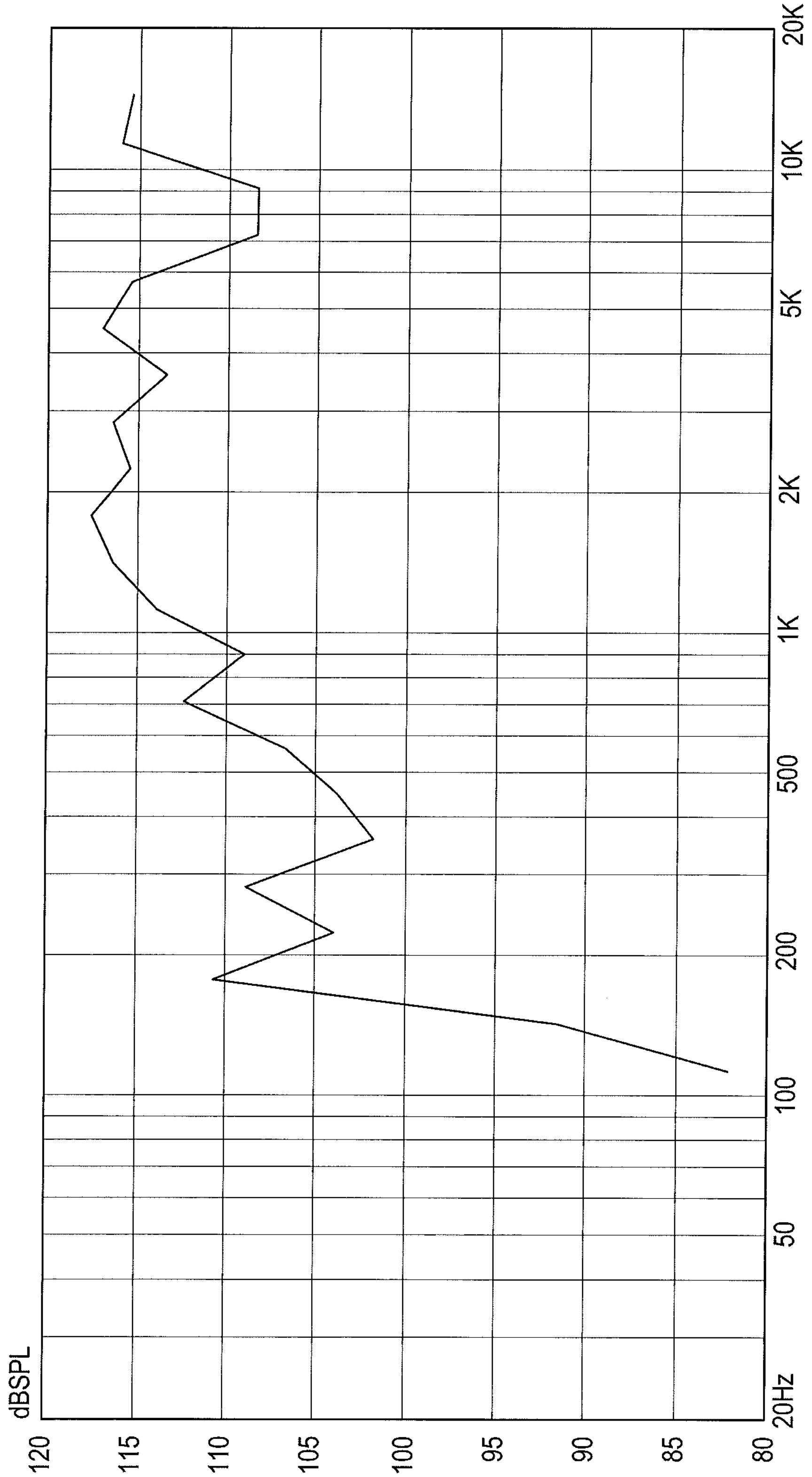
FIG. 9 is a plot of Sound Pressure Level (SPL) v. Frequency (in Hz) illustrating the sound pressure level reached with no more than one percent (1%) distortion for an exemplary embodiment the speaker of FIG. 1, in accordance with the present invention.
Figure 10:
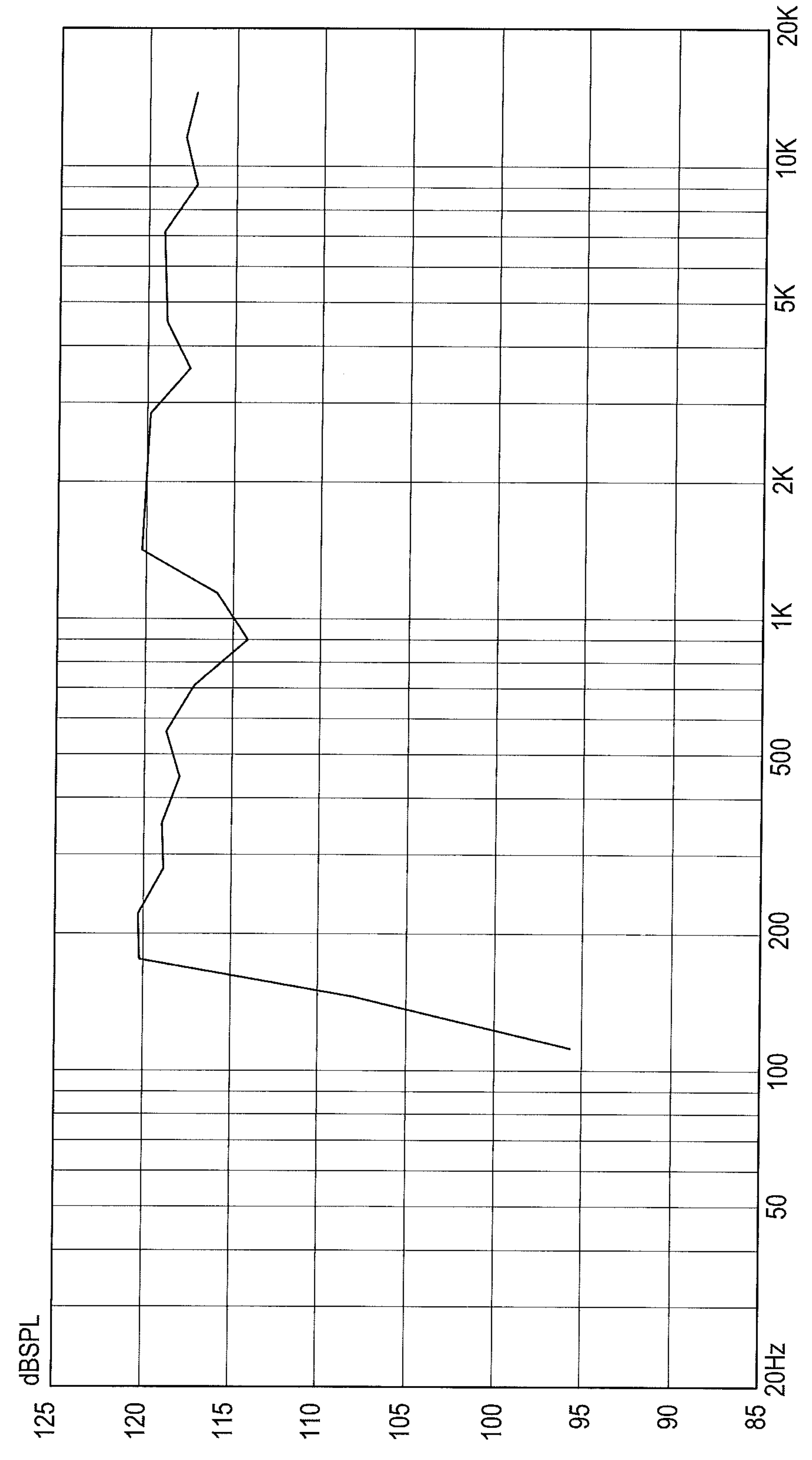
FIG. 10 is a plot of Sound Pressure Level (SPL) v. Frequency (in Hz) illustrating the sound pressure level reached with no more than five percent (5%) distortion for an exemplary embodiment the speaker of FIG. 1, in accordance with the present invention.

For distortion measurements, a program-controlled instrument applied a scripted series of tonebursts to the speaker 10 in increasing amplitudes until a preset condition was met. The maximum SPL for 1% THD and 5% THD are illustrated in FIGS. 9 and 10. For THD <1%, the speaker achieves at least 100 dB SPL from 170 Hz-20 kHz and for THD <5%, the speaker achieves at least 110 dB SPL from 150 Hz-20 kHz. These are very good distortion measurements for any speaker, and point out one of the key design features of the present invention. The small or shallow drivers of the prior art cannot match the power handling, distortion or sensitivity performance of the low profile speakers of the present invention. Typical prior art, shallow high quality drivers (e.g., 40-50 mm deep) are 50 mm drivers with much less (e.g., less than half) the radiating surface area (i.e., Sd) of the driver (e.g., 20) of the present invention. To reach the same sound pressure level (SPL), the prior art shallow high quality drivers would require substantially higher power and longer excursion to make up for the smaller Sd. The prior art driver's higher excursion leads directly to higher distortion. Placing all of these factors into perspective, applicant has measured some good quality conventional off-the-shelf 3" drivers recently; and those drivers were about 53 mm deep. Max SPL for 1% THD was observed to be about 96 dB SPL at 200 Hz, when measured under the same conditions as applied to the drivers of the present invention.

Having illustrated and described exemplary, preferred embodiments of a new and improved low-profile loudspeaker driver, enclosure assembly and method, it is believed that other modifications, variations and changes will be suggested to those skilled in the art in view of the teachings set forth herein. It is therefore to be understood that all such variations, modifications and changes are believed to fall within the scope of the present invention, as set forth in the following claims.

What is claimed is:

1. A low-profile loudspeaker assembly, comprising:

a loudspeaker enclosure having a front panel and a rear panel;

at least one speaker driver mounted in said enclosure, said driver including a forwardly facing voice coil driven sound radiator and a rearwardly extending motor structure for activating said voice coil;

an aperture in said rear panel receiving said motor structure; and wherein said loudspeaker assembly enclosure, when mounted on a wall, projects away from the wall's surface by a mounted depth of not more than 1.6 inches, and wherein said loudspeaker assembly, when mounted on said wall, will play with a measured distortion of not more than 1% at a sound pressure level of at least 100 dB over a frequency range from 170 Hz-20 kHz.

2. The assembly of claim 1, further including a thermally conductive gasket sealing said aperture around said motor structure and conducting heat from said motor structure.

3. The assembly of claim 2, further including a driver basket secured to said front panel and supporting said driver in said enclosure.

4. The assembly of claim 3, wherein said basket includes a support ring engaging said motor structure and said gasket, and wherein said rear panel and said basket are thermally conductive, whereby heat generated in said motor structure is transferred through said support ring and said gasket to said rear panel.

5. The assembly of claim 4, wherein said enclosure incorporates multiple speaker drivers.

6. The assembly of claim 3, wherein said voice coil driven sound radiator includes:

a diaphragm secured to said basket;

a cylindrical voice coil former secured at an upper end to an undersurface of said diaphragm and carrying a voice coil at a lower end, whereby activation of said voice coil drives said diaphragm;

a generally upwardly arcuate annular spider surrounding said voice coil former, the spider having an outer periphery secured to said basket and an inner periphery secured to said voice coil former.

7. The assembly of claim 6, wherein said spider is generally dome-shaped.

8. The assembly of claim 6, wherein said spider is generally planar, with L-shaped pleats in cross-section.

9. The assembly of claim 6, wherein said motor includes a cup carrying a permanent magnet and frontplate to provide a magnetic flux circuit for said voice coil, said cup being secured in said basket support ring and extending into said rear panel aperture.

10. A low-profile loudspeaker assembly, comprising:

a loudspeaker enclosure having a front panel and a rear panel, wherein said rear panel is highly thermally conductive;

at least one speaker driver mounted in said enclosure, said driver including:

a forwardly facing diaphragm driven by a voice coil former carrying a voice coil;

a rearwardly extending motor structure having a cup carrying a permanent magnet and frontplate to provide a magnetic flux circuit having a gap for receiving said voice coil;

an aperture in said rear panel receiving said motor structure cup; and a thermally conductive gasket sealing said aperture around said cup.

11. The low-profile loudspeaker assembly of claim 10, further including:

a basket secured to said front panel and supporting said driver in said enclosure, said basket including a support ring engaging said motor structure cup and said gasket, said rear panel and said basket being thermally conductive, whereby heat generated in said motor structure is transferred through said support ring and said gasket to said rear panel; and a generally upwardly arcuate annular spider surrounding said voice coil former, the spider having an outer periphery secured to said basket and an inner periphery secured to said voice coil former.

12. The low-profile loudspeaker assembly of claim 11, wherein said spider is annular, having an inner and an outer periphery, and is generally dome-shaped, the spider being connected at its outer periphery to said basket and curving upwardly and inwardly for connection at its inner periphery to the approximate vertical midpoint of said voice coil former.

13. The low-profile loudspeaker assembly of claim 11, wherein said spider is annular, having an inner and an outer periphery, and is generally L-shaped in cross-section, the spider being connected at its outer periphery to said basket and extending upwardly and inwardly for connection at its inner periphery to the approximate vertical midpoint of said voice coil former.

14. The low-profile loudspeaker assembly of claim 11, wherein said loudspeaker assembly, when mounted on said wall, will play with a measured distortion of not more than 1% and loudly, wherein the said speaker sound pressure level response is at least 100 dB over a frequency range from 170 Hz-20 kHz.

15. The low-profile loudspeaker assembly of claim 11, wherein said loudspeaker assembly, when mounted on said wall, will play with a measured distortion of not more than 5% and very loudly, wherein the said speaker's sound pressure level response is at least 110 dB over a frequency range from 150 Hz-20 kHz.

16. The low-profile loudspeaker assembly of claim 11, wherein said loudspeaker enclosure's rear panel is fabricated from a rigid metallic sheet of highly thermally conductive metal.

17. The low-profile loudspeaker assembly of claim 16, wherein said loudspeaker enclosure's rear panel is fabricated from a rigid metallic sheet of highly thermally conductive aluminum.

18. The low-profile loudspeaker assembly of claim 17, wherein said loudspeaker enclosure's rear panel is fabricated from a rigid metallic sheet of highly thermally conductive aluminum having a thickness greater than 2 mm.

19. The low-profile loudspeaker assembly of claim 17, wherein said loudspeaker enclosure's rear panel is fabricated from a rigid metallic sheet of highly thermally conductive aluminum having a thickness of approximately 2.5 mm.

20. A method for fabricating a low-profile loudspeaker assembly, comprising:

providing a loudspeaker enclosure having a front panel and a rear panel, wherein said rear panel is highly thermally conductive;

forming at least one aperture in said rear panel;

mounting at least one speaker driver in said enclosure, said driver including a forwardly facing diaphragm driven by a voice coil former carrying a voice coil, and a rearwardly extending motor structure having a cup carrying a permanent magnet and frontplate to provide a magnetic flux circuit having a gap for receiving said voice coil;

locating said at least one speaker driver in alignment with said at least one aperture in said rear panel so that said cup extends into said aperture; and providing a thermally conductive gasket in said aperture around said cup to provide thermal contact between said cup and said rear panel.

* * * * *